(12) United States Patent
Lee (10) Patent No.: US 7,741,652 B2
(45) Date of Patent: Jun. 22, 2010

(54) ALIGNMENT DEVICE AND APPLICATION THEREOF

(75) Inventor: Hsiao-Wen Lee, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 321 days.

(21) Appl. No.: 12/044,597

(22) Filed: Mar. 7, 2008

(65) Prior Publication Data
US 2009/0225431 A1    Sep. 10, 2009

(51) Int. Cl.
*H01L 21/12* (2006.01)
*H01L 21/76* (2006.01)

(52) U.S. Cl. .................. 257/98; 257/432; 257/797; 257/E23.068; 257/E23.179; 438/401; 438/462

(58) Field of Classification Search .................. None
See application file for complete search history.

(56) References Cited

U.S. PATENT DOCUMENTS

| 6,042,391 | A | * | 3/2000 | Bodo et al. | ................... 439/74 |
|---|---|---|---|---|---|
| 6,166,437 | A | * | 12/2000 | Dhong et al. | ................ 257/723 |
| 6,492,720 | B1 | * | 12/2002 | Yamaguchi et al. | ......... 257/686 |
| 6,627,822 | B2 | * | 9/2003 | Jackson et al. | ............. 174/260 |
| 2008/0099904 | A1 | * | 5/2008 | Chou et al. | ................. 257/686 |

FOREIGN PATENT DOCUMENTS

WO    WO-2004/027880 A2    4/2004

* cited by examiner

*Primary Examiner*—Alonzo Chambliss
(74) *Attorney, Agent, or Firm*—Muncy, Geissler, Olds & Lowe, PLLC (57) ABSTRACT

An alignment device and applications thereof are disclosed. The device comprises a dam structure disposed on a first substrate, and a post disposed on a second substrate at a position corresponding to the dam structure. The dam structure comprises a groove. The post is disposed in the groove of the dam structure when bonding the first and second substrates.

23 Claims, 15 Drawing Sheets

ALIGNMENT DEVICE AND APPLICATION THEREOF

BACKGROUND OF THE INVENTION

1. Field of the Invention

The invention relates to semiconductor technology and more particularly to a light sensing device.

2. Description of the Related Art

In WO 2004/027880 A2, a spacer wafer between two lens wafers to maintain a gap therebetween is disclosed. It is critical to align the substrates because alignment errors therebetween may negatively affect the optical performance of the final light sensing device.

The lenses on the lens wafers are typically formed of transparent polymer cured by illumination of ultraviolet (UV) light or heating. The lens substrates are usually deformed and thus have serious warpage during the lens replication process or substrate bonding process. The spacer and lens substrates typically comprise alignment marks at either side thereof. Due to warpage of the substrates, even if the alignment marks are accurately aligned, and then the substrates are bonded, the corresponding lenses and the spacers of the substrate cannot be accurately aligned.

BRIEF SUMMARY OF THE INVENTION

Embodiments of the invention provide alignment devices that prevent alignment errors between light sensing devices, lenses, and spacers.

An embodiment of the invention further provides an alignment device comprising a dam structure disposed on a first substrate, and a post disposed oil a second substrate at a position corresponding to the dam structure. The dam structure comprises a groove. The post is disposed in the groove of the dam structure when bonding the first and second substrates.

An embodiment of the invention further provides a lens module comprising a lens substrate, a spacer substrate, and an alignment device. The lens substrate comprises a plurality of lenses on a lens surface thereof. The spacer substrate comprises a bonding surface bonding to the lens surface of the lens substrate. The spacer substrate comprises a plurality of through holes respectively exposing the lenses. The alignment device comprises a dam structure and a post. The dam structure comprises a groove. One of the dam structures and the post is disposed on the lens surface of the lens substrate, and the other is disposed on the bonding surface of the spacer substrate. The post is disposed in the groove of the dam structure.

An embodiment of the invention further provides a semiconductor device, comprising a semiconductor wafer, a lens substrate, and an alignment device. The semiconductor wafer comprises a plurality chips on an active surface thereof. The lens substrate comprises a bonding surface bonding to the active surface of the semiconductor wafer. The lens substrate comprises a plurality of lenses respectively over the chips. The alignment device comprises a dam structure and a post. The dam structure comprises a groove. One of the dam structures and the post is disposed on the active surface of the lens substrate, and the other is disposed on the bonding surface of the lens substrate. The post is disposed in the groove of the dam structure.

Further scope of the applicability of the invention will become apparent from the detailed descriptions given hereinafter. It should be understood however, that the detailed descriptions and specific examples, while indicating preferred embodiments of the invention, are given by way of illustration only, as various changes and modifications within the spirit and scope of the invention will become apparent to those skilled in the Art from the detailed descriptions.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
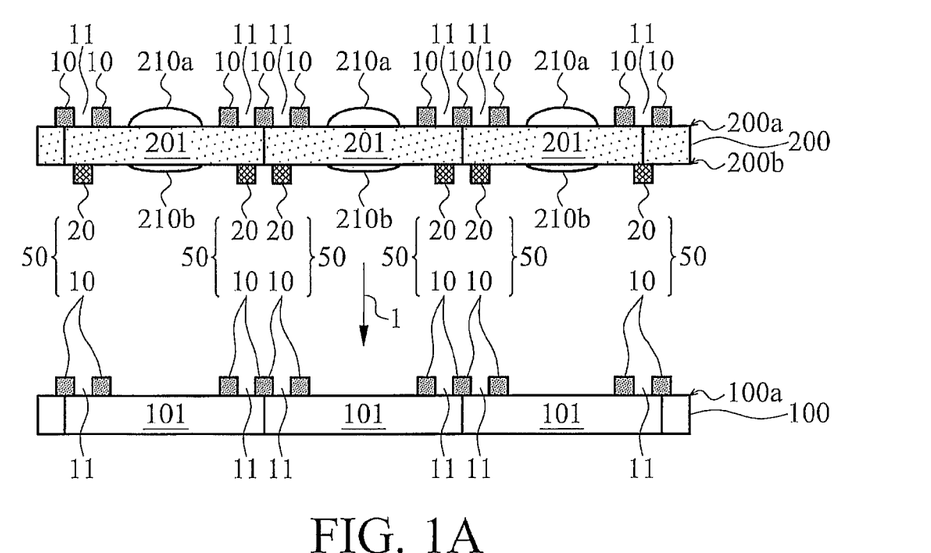
FIGS. 1A and 1B show cross-sections of an alignment device of a preferred embodiment of the invention and an application thereof.
Figure 1B:
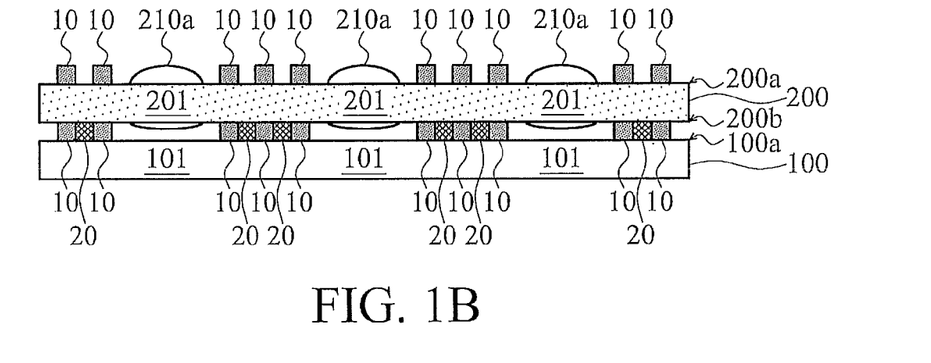

FIGS. 1A and 1B show cross-sections of an alignment device 50 of a preferred embodiment of the invention and an application thereof. The alignment device 50 comprises a dam structure 10 disposed on a substrate 100 and a post 20 disposed on a substrate 200. The dam structure 10 comprises a groove 11. Exemplary top views of the dam structure 10 and the post 20 are subsequently described. In this embodiment, the substrate 100 is a semiconductor wafer comprising a plurality of chips 101, and the substrate 200 is a lens substrate comprising a plurality of units 201 corresponding to the chips 101.

In FIG. 1A, the dam structure 10 is disposed on an active surface 100a of the substrate 100, and the post 20 is disposed on a bonding surface 200b of the substrate 200. In other embodiments, the post 20 may be disposed on the active surface 100a of the substrate 100, and the dam structure 10 may be disposed on the bonding surface 200b of the substrate 200. The substrate 200 comprises a lens surface 200a and a bonding surface 200b opposite to the lens surface 200a. In this embodiment, every unit 201 comprises a lens 210a on the lens surface 200a and a lens 210b on the bonding surface 200a, and the lenses 210a and 210b in the same unit 201 act as a lens set. In some embodiments, every unlit 201 has at most one lens disposed on the lens surface 200a. For some structures, such as that shown in FIG. 2B, to the lens is aligned with and disposed on the lens surface 200a of the substrate 200, the corresponding dam structure 10 is disposed on the lens surface 200a. In other embodiments, the dam structure 10 on the lens surface 200a shown in FIG. 1A can be replaced by corresponding posts 20. In this embodiment, the post 20 is disposed on the bonding surface 200b, and the dam structure 10 is disposed on the lens surface 200a. In some embodiments, one of the dam structures 10 and the post 20 can be disposed on both of the surfaces 200a and 200b, and is preferably of the same materials with the lenses 210a and 210b.

In FIG. 1A, the substrate 200 is aligned with the substrate 100, and then is moved in a direction 1 to bond to the substrate 100, disposing the post 20 in the corresponding groove 11 of the dam structure 10, completing the semiconductor device shown in FIG. 1B. Specifically, the bonding surface 200b of the substrate 200 is bonded to the active surface 100a of the substrate 100, and the lenses 210a and 210b are disposed over the corresponding chips 101.

Figure 2A:
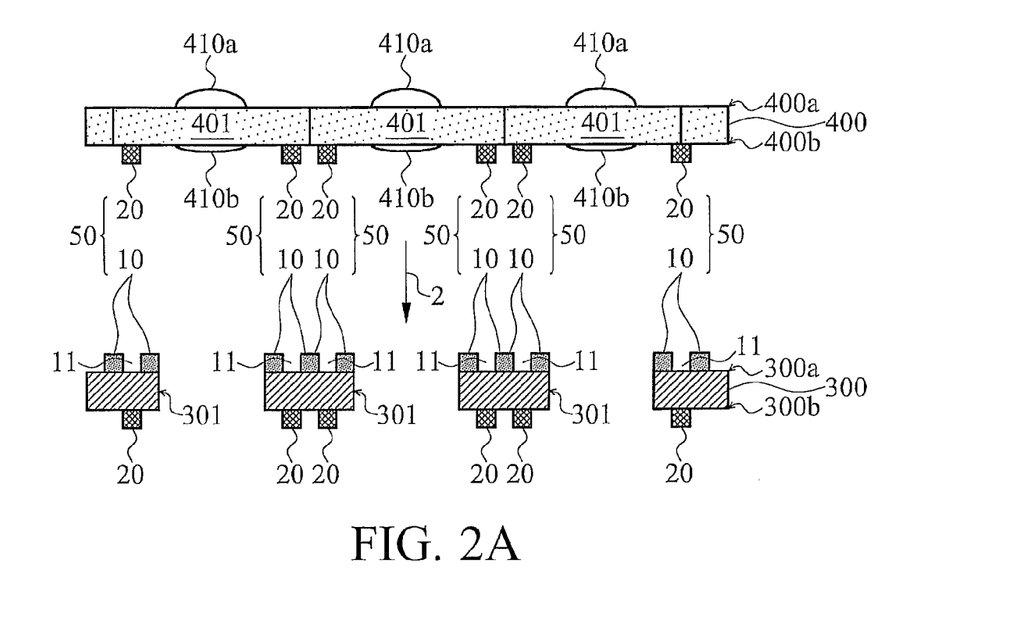
FIGS. 2A and 2B show cross-sections of an alignment device of a preferred embodiment of the invention and another application thereof.
Figure 2B:
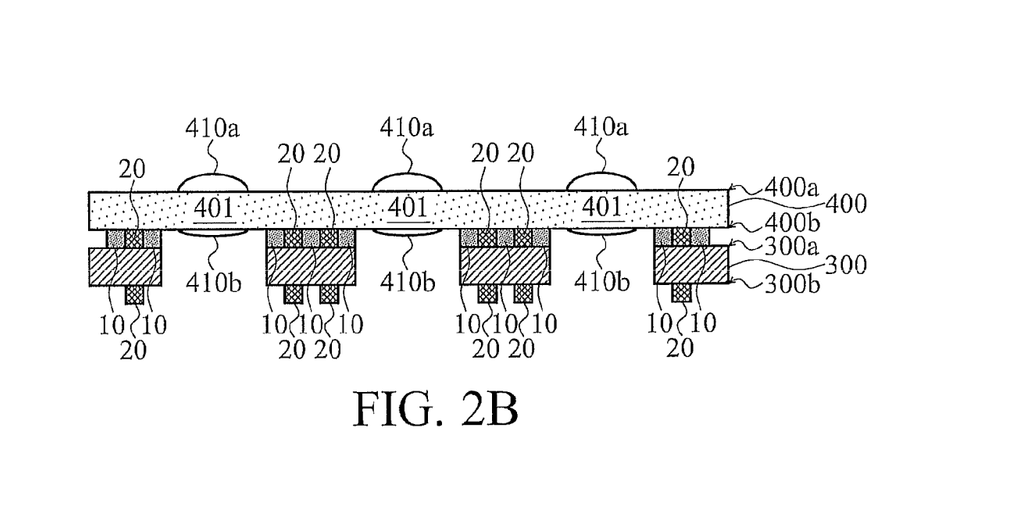

FIGS. 2A and 2B show cross-sections of another application of the alignment device 50. The alignment device 50 comprises a dam structure 10 disposed on a substrate 300 and a post 20 disposed on a substrate 300. The dam structure 10 comprises a groove 11. Exemplary top views of the dam structure 10 and the post 20 are subsequently described. In this embodiment, the substrate 300 is a spacer substrate comprising a plurality of through holes 301, and the substrate 400 is a lens substrate comprising a plurality of units 401 corresponding to the through holes 301. The design of the through holes 301 corresponds to the units 201 of the substrate 200, for the spacer substrate 300 to align with and bond to the substrate 200 shown in FIG. 1B.

In FIG. 2A, the dam structure 10 is disposed on a bonding surface 300a of the substrate 300, and the post 20 is disposed on a lens surface 400b of the substrate 400. In other embodiments, the post 20 may be disposed on the bonding surface 300a of the substrate 300, and the dam structure 10 may be disposed on lens surface 400b of the substrate 400. The substrate 400 comprises opposite lens surfaces 400a and 400b, every unit 401 comprises a lens 410a on the lens surface 400a and a lens 410b on the lens surface 400a, and the lenses 410a and 410b in the same unit 201 act as a lens set. In some embodiments, every unit 401 has at most one lens disposed on either lens surface 400a or 400b. In this embodiment, the substrate 300 is to be bonded to the substrate 200 shown in FIG. 1B, and the corresponding posts 20 are disposed on the bonding surface 300b to align with the corresponding grooves 11 of the dam structures 10 on the lens substrate 200a of the substrate 200. In other embodiments, the dam structures 10 on the lens surface 200a shown in FIG. 1B and the posts 20 on the bonding surface 300b of the substrate 300 can be interchanged. The post 20 on the lens surface 400b is preferably of the same materials with the lenses 410a and 410b.

In FIG. 2A, the substrate 400 is aligned with the substrate 300, and then is moved in a direction 2 to bond to the substrate 300, disposing the post 20 in the corresponding groove 11 of the dam structure 10, completing the lens module shown in FIG. 2B. Specifically, the lens surface 400b of the substrate 400 is bonded to the bonding surface 300a of the substrate 300, and the lenses 410b are exposed by the corresponding through holes 301.

Figure 3:
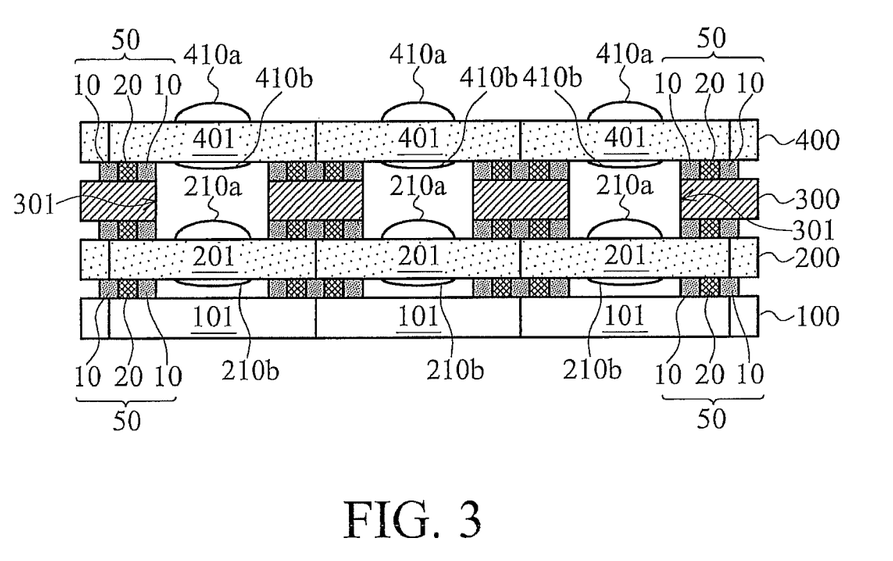
FIG. 3 shows a cross-section of an image sensing device utilizing an alignment device of a preferred embodiment of the invention.

Finally, the bonding surface 300b of the substrate 300 shown in FIG. 2B is aligned and bonded to the lens surface 200a of the substrate 200 shown in FIG. 1B, and the post 20 on the bonding surface 300b is disposed into the corresponding groove 11 of the corresponding dam structure 10, completing the image sensing device shown in FIG. 3.

Figure 4A:
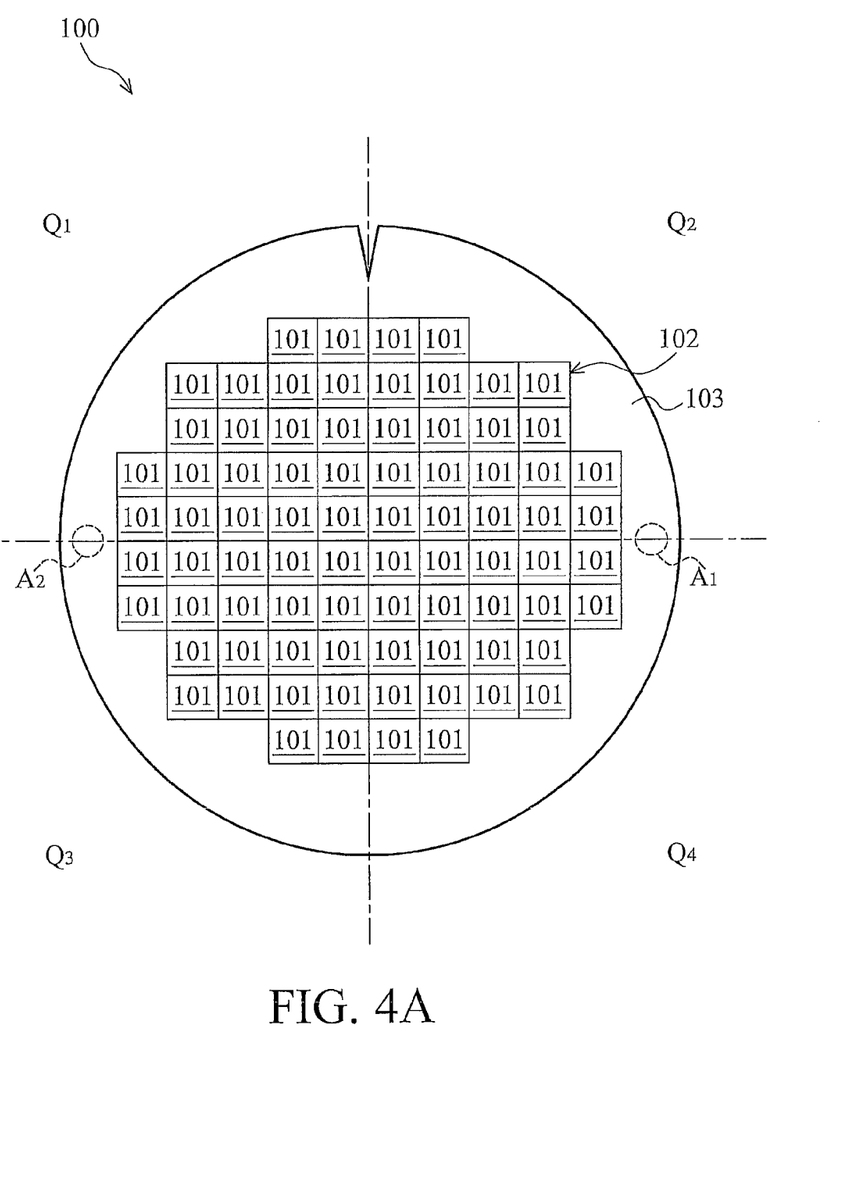
FIG. 4A shows a top view of a semiconductor substrate of the image sensing device shown in FIG. 3.
Figure 4B:
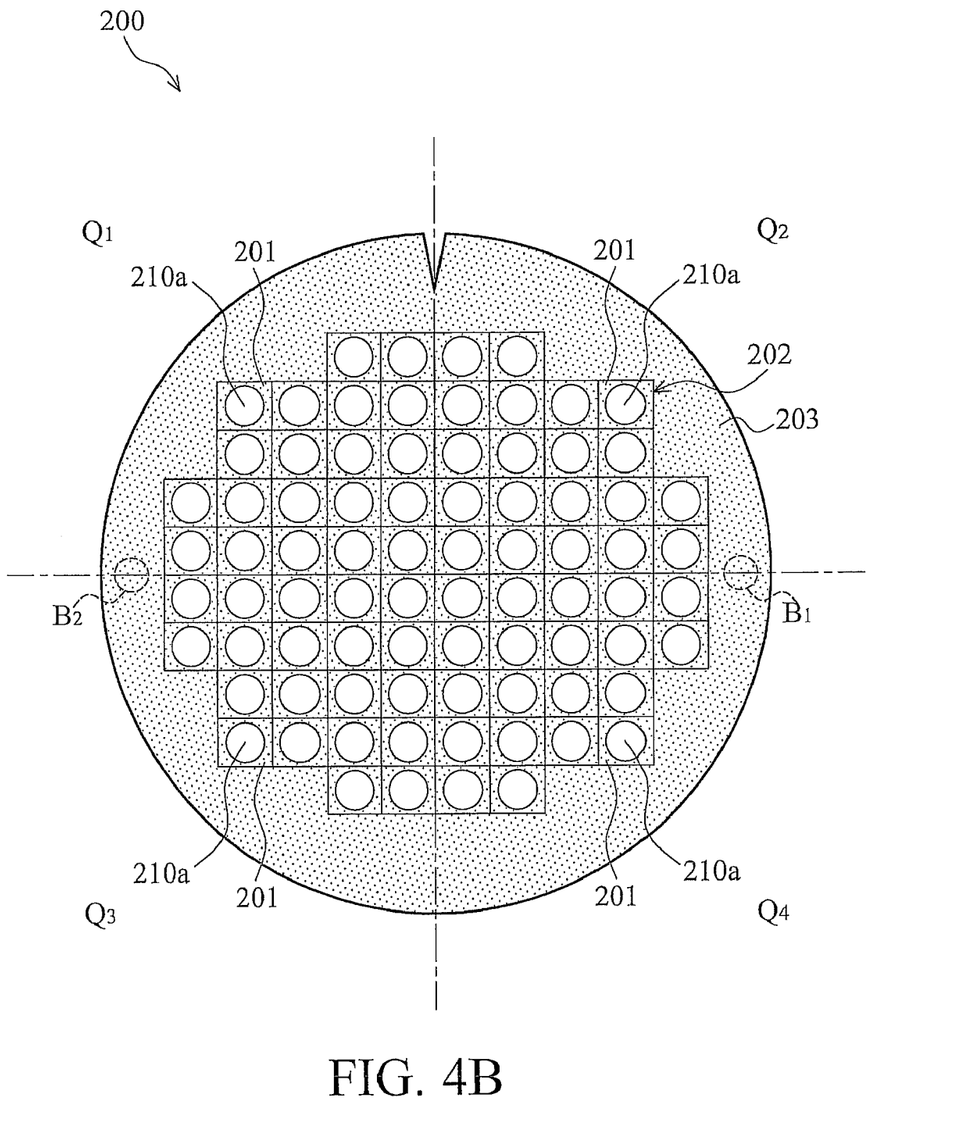
FIG. 4B shows a top view of a lens substrate of the image sensing device shown in FIG. 3.
Figure 4C:
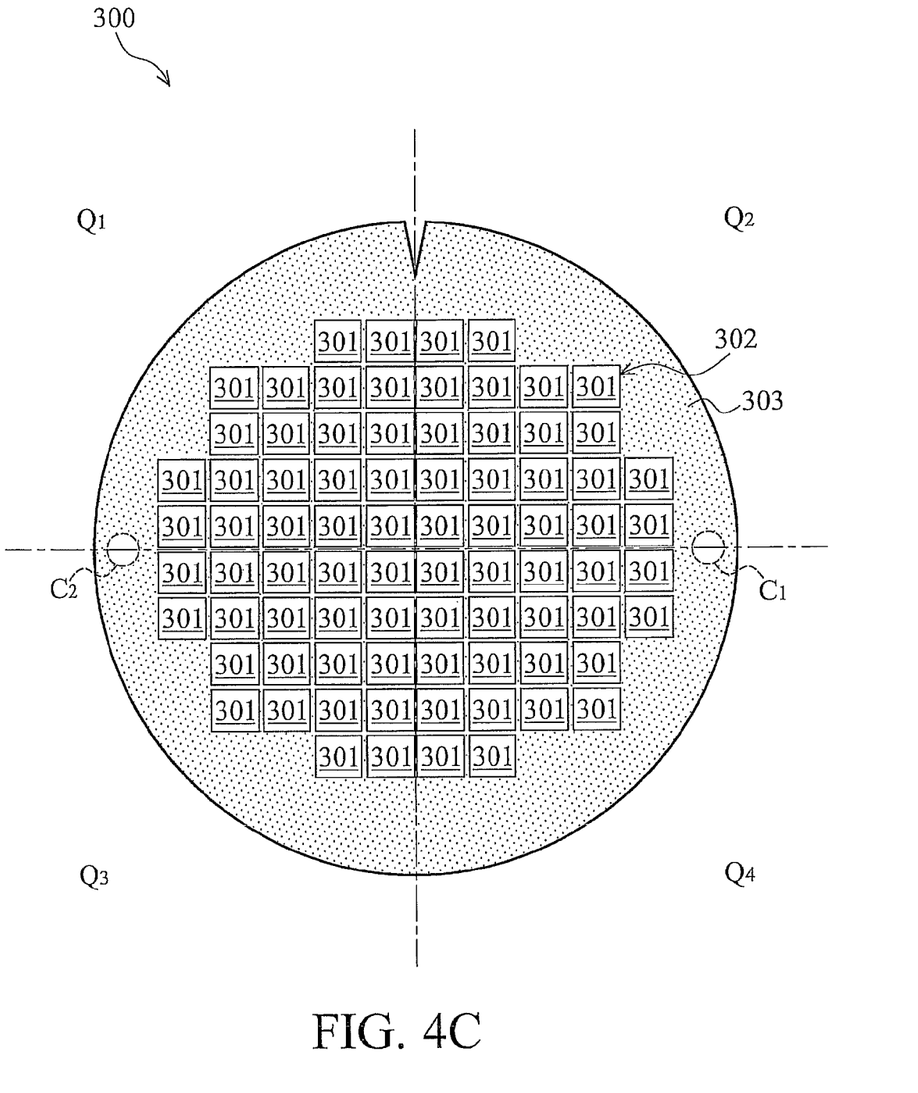
FIG. 4C shows a top view of a spacer substrate of the image sensing device shown in FIG. 3.

FIGS. 4A through 4C respectively show top views of the substrates 100 through 300 of the image sensing device shown in FIG. 3. The top view of the substrate 400 shown in FIG. 3 is similar with that of the substrate 200, and thus, is omitted herefrom. Further, subsequently described properties of the substrate 200 are all similar and compatible with those of the substrate 400.

In FIG. 4A, the chips 101 of the substrate 100 are arranged in a matrix 102, and substrate 100 further comprises a periphery region 103 around the chips 101. In FIG. 4B, the units 201 of the substrate 200 are arranged in a matrix 202, and the substrate 200 comprises an edge region 203 around the matrix 202. In FIG. 4C, the through holes 301 of the substrate 300 are arranged in a matrix 302, and the substrate 300 comprises a periphery region 303 around the matrix 302. The regions 103, 203, and 303 of the substrates 100 through 300 are corresponding to each other. The matrixes 102, 202, and 302 are also corresponding to each other, and can be divided into corresponding quarter areas $Q_1$ through $Q_4$. Every chip 101 is allocated a corresponding unit 201 and through hole 301.

In FIGS. 1B and 2B, the alignment devices 50 of a preferred embodiment of the invention are disposed in the corresponding chips 101, units 201, and/or the substrate 300 between the through holes 301 in the matrix 302. In other embodiments, the alignment devices 50 can be alternatively disposed in corresponding positions (such as the set of $A_1, B_1, C_1$, and/or the set of $A_2, B_2, C_2$) of the regions 103, 203, 303.

FIGS. 5A through 5C, 6A through 6C, 7A through 7C, and 8A through 8D show top views of some exemplary types of the alignment device 50 of a preferred embodiment of the invention, and the alignment device 50 are utilized for alignment between the substrates 100 and 200. In other embodiments, the alignment device 50 may also be utilized for alignment between any substrates to be bonded and disposed in any position of the substrates.

Figure 5A:
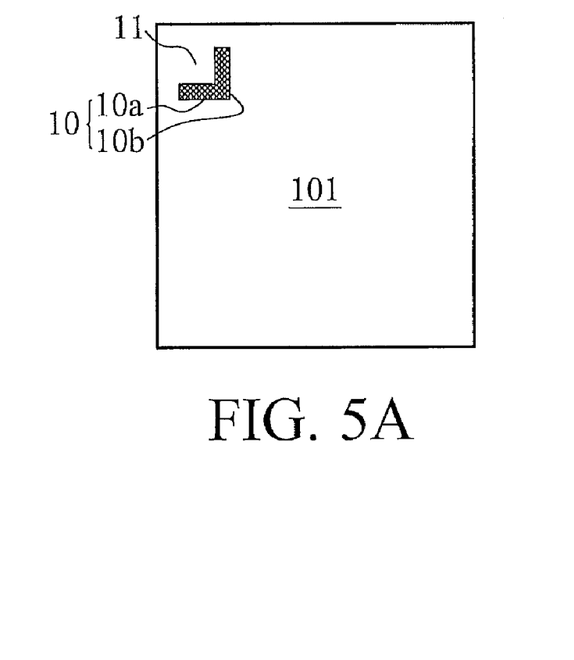
FIGS. 5A through 5C show top views of one of the exemplary types of the alignment device of a preferred embodiment of the invention.
Figure 5B:
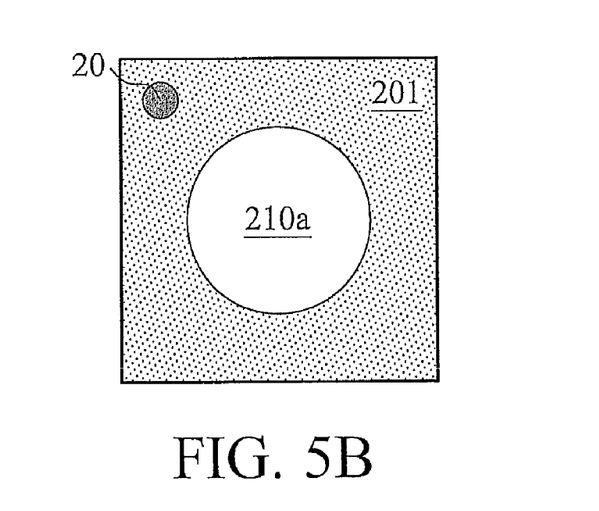

In FIG. 5A, the dam structure 10 is disposed at a corner of the chip 101, and is protruding from the active surface 100a (referring to FIG. 1A). The dam structure 10 comprises two arms 10a and 10b, and a groove 11 between the arms 10a and 10b. In FIG. 5B, the post 20 is protruding from the bonding surface 200b (referring to FIG. 1A) at a position corresponding to where the dam structure 10 is beyond the lens 210b (referring to FIG. 1A). The dimension of the post 20 depends on that of the groove 11.

When there is slight horizontal deviation (such as smaller than 5 μm) between the groove 11 and the post 20 during bonding of the substrates 100 and 200 (referring to FIG. 1A), the profile of the dam structure 10 and the post 20 can guide the post 20 to be disposed in the corresponding groove 11. For example, alignment is assisted when the post 20 has a tapered end and/or the dam structure 10 has sloping sidewalls.

Figure 5C:
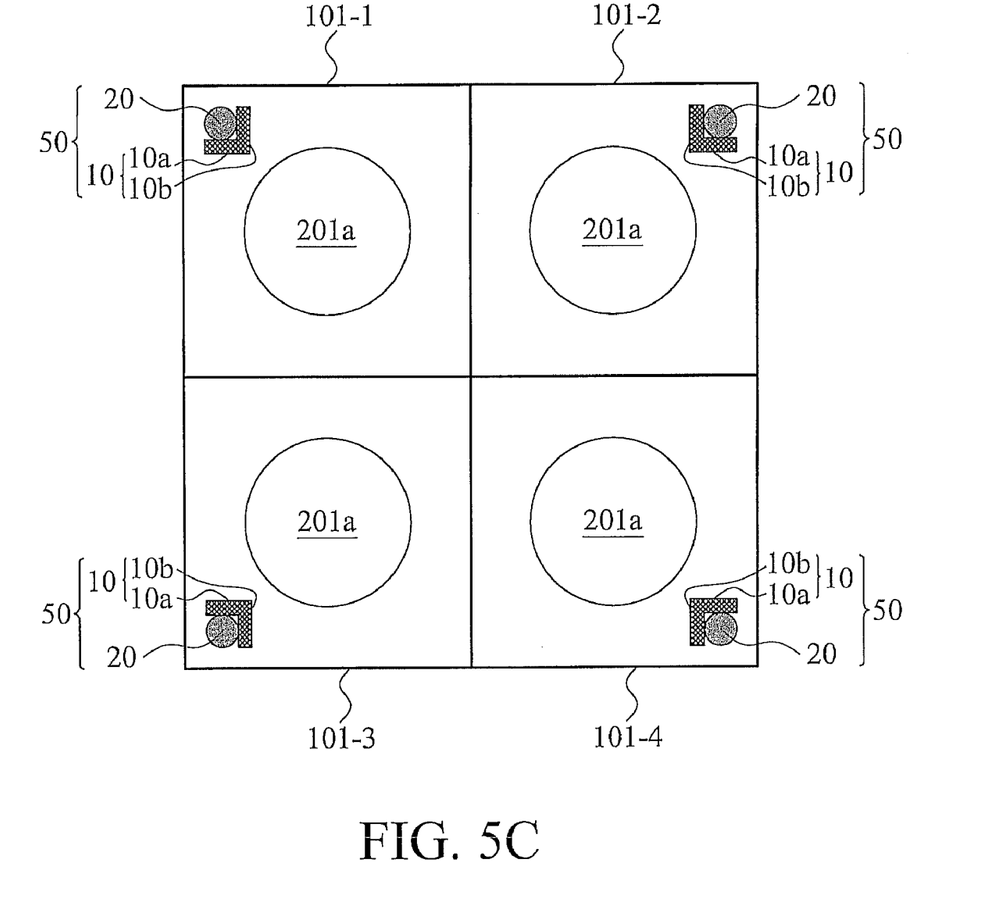

FIG. 5C shows an exemplary top view of the structure shown in FIG. 1B. The post 20 is disposed in the groove 11 (referring to FIG. 5A), and clipped by the arms 10a and 10b. In this embodiment, the chip 101-1 is one of the chips 101 in area Q1 of the matrix 102 (Referring to FIG. 4A), the chip 101-2 is one of the chips 101 in area Q2 of the matrix 102, the chip 101-3 is one of the chips 101 in area Q3 of the matrix 102, and the chip 101-4 is one of the chips 101 in area Q4 of the matrix 102. In other embodiments, the chips 101-1 through 101-4 may be any four of the chips 101 shown in FIG.

4A. The alignment devices 50 are respectively disposed at an upper-left corner of the chip 101-1, an upper-right corner of the chip 101-2, a lower-left corner of the chip 101-3, and a lower-right corner of the chip 101-4 according to substrates 100 and 200 warpage. In some embodiments, one or more of the alignment devices can be disposed in one chip 101 at any position thereof. In some embodiments, every several chip 101 or the entire matrix 102 (referring to FIG. 4A) has one alignment device 50. In an alternative embodiment, the alignment device 50 is not disposed in the chip 101, but at any position in the regions 103 and 203 shown in FIGS. 4A and 4B.

Figure 6A:
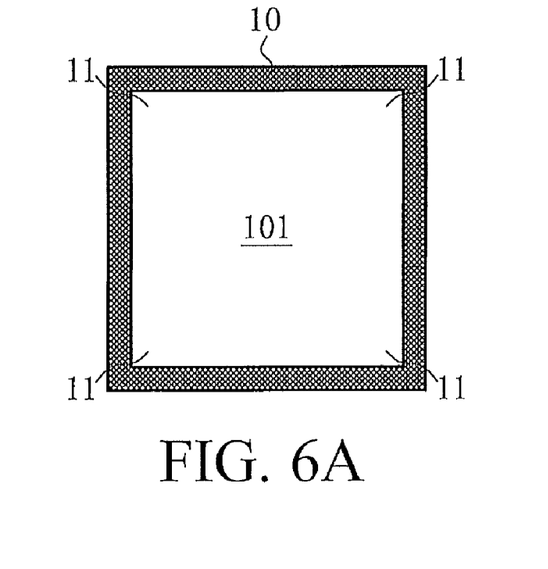
FIGS. 6A through 6C show top views of one of the exemplary types of the alignment device of a preferred embodiment of the invention.
Figure 6B:
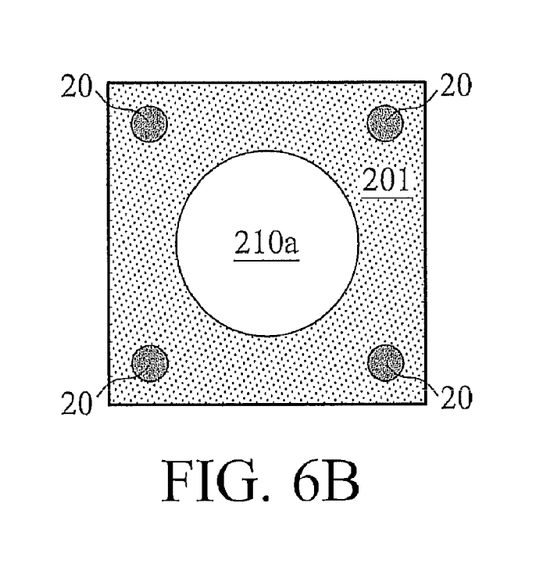

In FIG. 6A, the dam structure 10 is an enclosing wall protruding from the active surface 100*a* (referring to FIG. 1A), and the corners thereof form the grooves 11. When applied to the spacer substrate 300 shown in FIG. 2A, the parts thereof, which are between the through holes 301, can be utilized as the dam structure 10. Of course, a protruding dam structure on the substrate parts between the through holes 301 can be alternatively formed. In FIG. 6B, four posts 20 are protruding from the bonding surface 200*b* (referring to FIG. 1A) at four corresponding (to the grooves 11) positions of the unit 201 beyond the lens 210*b* (referring to FIG. 1A). In other embodiments, the quantity of the posts 20 can be less than four as required. The dimensions of the posts 20 depend on those of the corresponding grooves 11.

Figure 6C:
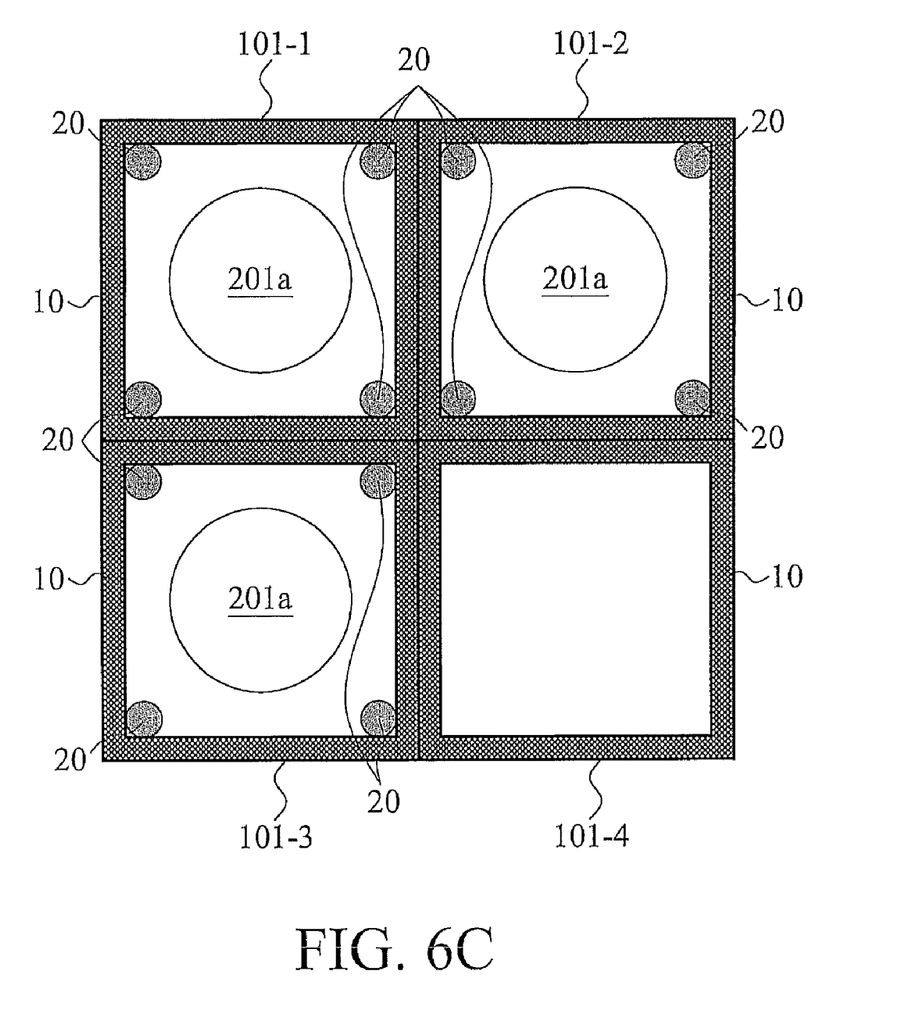

FIG. 6C shows an exemplary top view of the structure shown in FIG. 1B. The posts 20 are disposed in the corresponding grooves 11 (referring to FIG. 6A), and clipped by neighboring components of the wall of the dam structure 10. The explanations of the chips 101-1 through 101-4 are similar with aforementioned explanations. In this embodiment, the chip 101-4 is a failed chip, and thus, no alignment device is disposed therein, and no lens is disposed over the failed chip. In some embodiments, every several chip 101 or the entire matrix 102 (referring to FIG. 4A) has one alignment device comprising the dam structure 10 shown in FIG. 6A and the post 20 shown in FIG. 6B. In an alternative embodiment, the alignment device comprising the dam structure 10 shown in FIG. 6A and the post 20 shown in FIG. 6B is not disposed in the chip 101, but at any position in the regions 103 and 203 shown in FIGS. 4A and 4B.

Figure 7A:
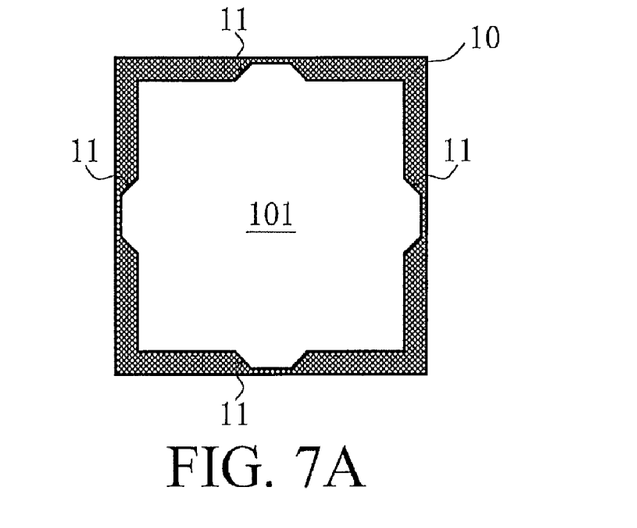
FIGS. 7A through 7C show top views of one of the exemplary types of the alignment device of a preferred embodiment of the invention.
Figure 7B:
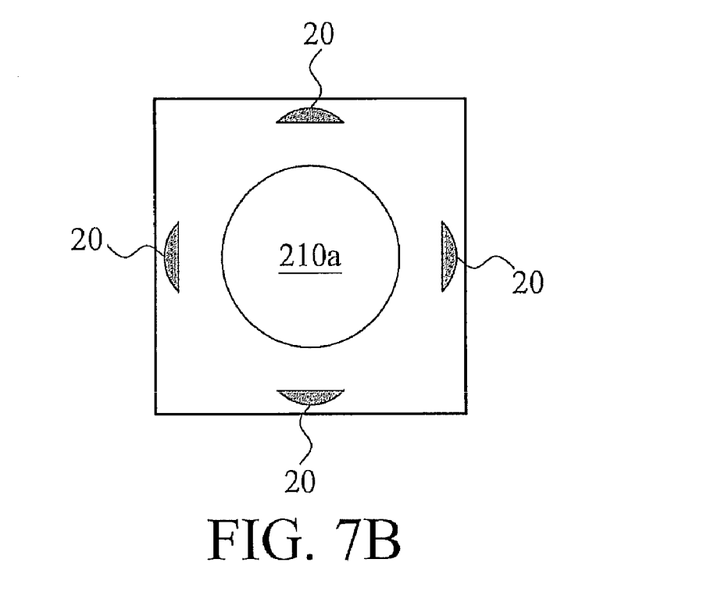

In FIG. 7A, the dam structure 10 is an enclosing wall protruding from the active surface 100*a* (referring to FIG. 1A), and comprises trapezoid recesses at each side thereof acting as the grooves 11. In other embodiments, the quantity of the grooves 11 in one chip 101 can be more than four or less than four as required. When applied to the spacer substrate 300 shown in FIG. 2A, the parts thereof, which are between the through holes 301, can be utilized as the dam structure 10. Additionally, the protruding dam structure on the substrate parts between the through holes 301 can be alternatively formed. In FIG. 7B, four vaulted-shape posts 20 are protruding from the bonding surface 200*b* (referring to FIG. 1A) at four corresponding (to the grooves 11) positions of the unit 201 beyond the lens 210*b* (referring to FIG. 1A). In other embodiments, the quantity of the posts 20 can be more than foul or less than four as corresponding to the quantity of the grooves 11. The dimensions of the posts 20 depend on those of the corresponding grooves 11.

Figure 7C:
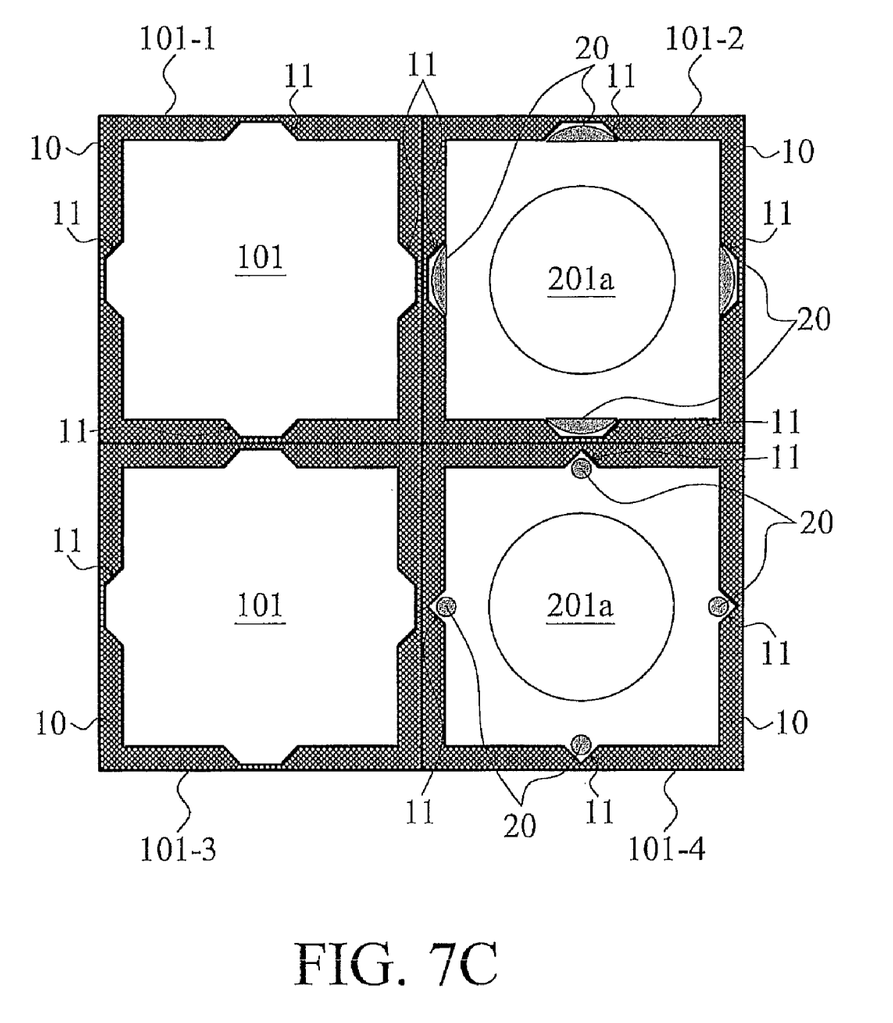

FIG. 7C shows an exemplary top view of the structure shown in FIG. 1B. The posts 20 are disposed in the corresponding grooves 11 (referring to FIG. 7A). The explanations of the chips 101-1 through 101-4 are similar with aforementioned explanations. In this embodiment, the chips 101-1 and 101-3 are failed chips, and thus, no alignment device is disposed therein, and no lens is disposed over the failed chip.

Regarding the chip 101-4, the grooves 11 therein are triangular and the posts 20 are cylindrical. In some embodiments, the bonding substrate may comprise several types of dam structures and posts as required. In some embodiments, every several chip 101 or the entire matrix 102 (referring to FIG. 4A) has one alignment device comprising the dam structure 101 shown in FIG. 7A and the post 20 shown in FIG. 7B. In an alternative embodiment, the alignment device comprising the dam structure 10 shown in FIG. 7A and the post 20 shown in FIG. 7B is not disposed in the chip 101, but at any position in the regions 103 and 203 shown in FIGS. 4A and 4B.

Figure 8A:
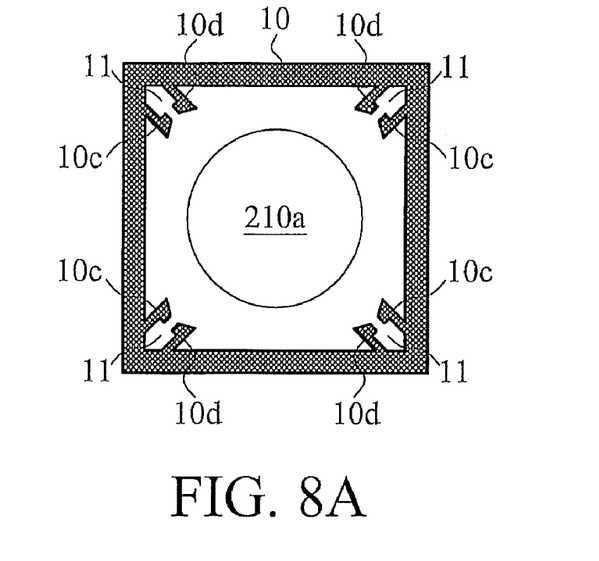
FIGS. 8A through 8D show top views of one of the exemplary types of the alignment device of a preferred embodiment of the invention.
Figure 8B:
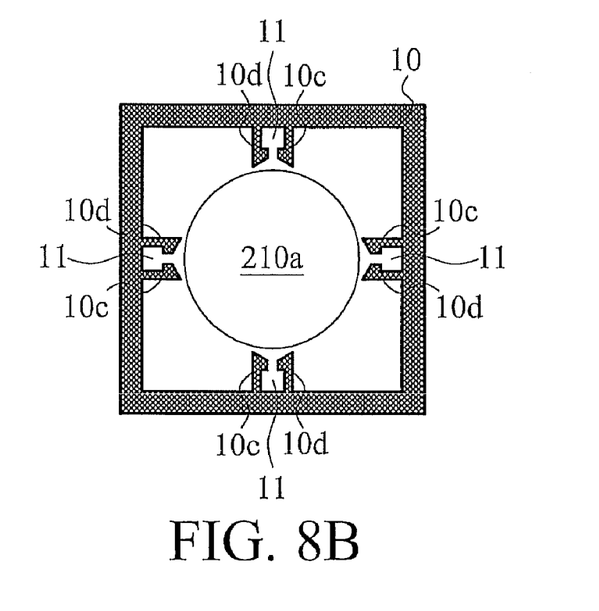

In FIGS. 8A and 8B, the dam structure 10 is an enclosing wall protruding from the active surface 100*a* (referring to FIG. 1A). In FIG. 8A, the corners of the enclosing wall form the grooves 11, and the dam structure 10 further comprises two flexible arms 10*c* and 10*d* extend from the enclosing wall and surrounds the grooves 11. The set of flexible arms 10*c* and 10*d* can be utilized for at least one groove 11, and is utilized for four grooves 11 in this embodiment. When applied to the spacer substrate 300 shown in FIG. 2A, the parts thereof, which are between the through holes 301, can be utilized as the dam structure 10. Additionally, the protruding dam structure on the substrate parts between the through holes 301 can be alternatively formed.

FIG. 8B shows a modification of FIG. 8A. In FIG. 8B, four sets of flexible arms 10*c* and 10*d* are disposed at each side of the enclosing wall, and the corresponding flexible arms 10*c*, 10*d*, and the enclosing wall therebetween surrounds the grooves 11. In other embodiments, the quantity of the groves 11 in FIG. 8B can be more than four or less than four. In some embodiments, the types of the grooves 11 shown in FIGS. 8A and 8B can be disposed in the same chip 101.

Figure 8C:
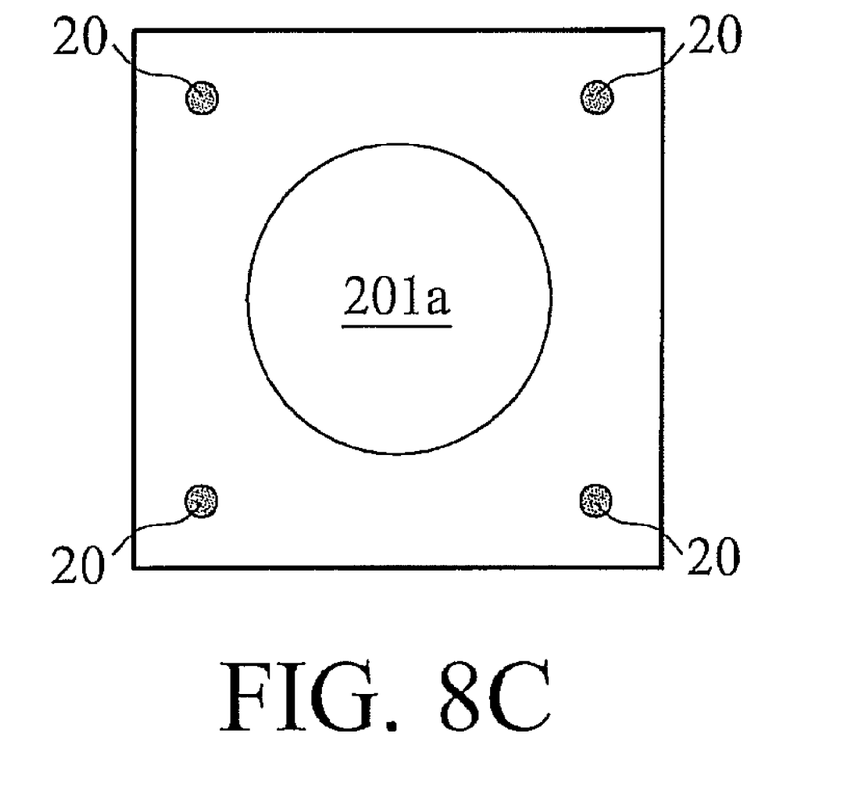

In FIG. 8C, four posts 20 are protruding from the bonding surface 200*b* (referring to FIG. 1A) at four corresponding (to the grooves 11 shown in FIG. 8A or 8B) positions of the unit 201 beyond the lens 210*b* (referring to FIG. 1A). In other embodiments, the quantity of the posts 20 can be less than four as required. The dimensions of the posts 20 depend on those of the corresponding grooves 11.

Figure 8D:
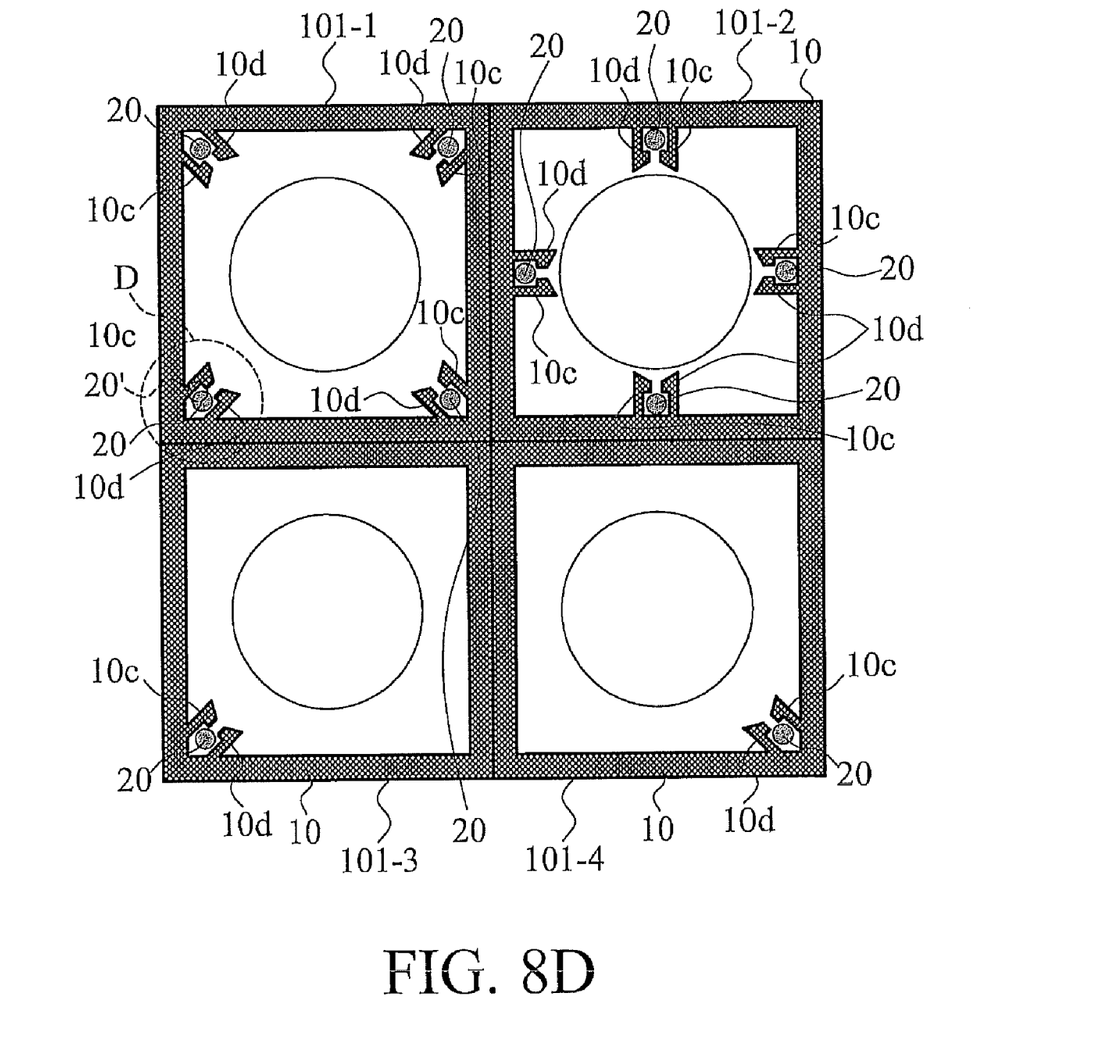

FIG. 8D shows an exemplary top view of the structure shown in FIG. 1B. The posts 20 are disposed in the corresponding grooves 11 (referring to FIG. 8A or 8B), and clipped by the flexible arms 10*c* and 10*d*. The explanations of the chips 101-1 through 101-4 are similar with aforementioned explanations. In this embodiment, the chip 101-1 utilizes the structure shown in FIG. 8A, the chip 101-2 utilizes the structure shown in FIG. 8A, only one set of the flexible arms 10*c* and 10*d* are utilized at the lower-left corner of the chip 101-3, and only one set of the flexible arms 10*c* and 10*d* are utilized at the lower-right corner of the chip 101-4. In some embodiments, every several chip 101 or the entire matrix 102 (referring to FIG. 4A) has one alignment device comprising the dam structure 101 shown in FIG. 8A or 8B, and the post 20 shown in FIG. 8C. In an alternative embodiment, the alignment device, comprising the dam structure 10 shown in FIG. 8A or 8B, and the post 20 shown in FIG. 8C, is not disposed in the chip 101, but at any position in the regions 103 and 203 shown in FIGS. 4A and 4B.

Referring to the area D shown in FIG. 8D, when there is slight horizontal deviation (such as smaller than 5 μm) between the groove 11 and the post 20 which causes the position of the post 20 to shift to the position 20' during bonding of the substrates 100 and 200 (referring to FIG. 1A), the post 20 may deform and/or stretch the flexible arms 10*c* and 10*d* under exertion of the bonding force. The elastic force from the flexible arms 10*c* and 10*d* may force or guide the post 20 to the normal position when the post 20 partially or completely enters the groove 11. Thus, the substrates 100 and 200 are well aligned. Further, the post 20 may have a tapered end and/or the dam structure 10 may have sloping sidewalls to assist alignment.

As described, the efficacy of the inventive alignment device provides prevention of alignment errors between light sensing devices, lenses, and spacers.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. An alignment device, comprising:
   a dam structure, comprising a groove, disposed on a first substrate; and
   a post disposed on a second substrate having a plurality of lenses at a position corresponding to the dam structure, wherein the post is disposed in the groove of the dam structure when bonding the first and second substrates.

2. The device as claimed in claim 1, wherein the dam structure comprises two arms clipping the post when bonding the first and second substrates.

3. The device as claimed in claim 2, wherein the arms are flexible.

4. The device as claimed in claim 1, further comprising two flexible arms extending from the dam structure, wherein the flexible arms and the dam structure surrounds the post when bonding the first and second substrates.

5. The device as claimed in claim 1, wherein the first substrate comprises a first lens, and the dam structure and the first lens are of the same material.

6. The device as claimed in claim 1, wherein the second substrate comprises a plurality of lenses, and the post and the lens are of the same material.

7. A lens module, comprising:
   a lens substrate comprising a plurality of lenses on a lens surface thereof;
   a spacer substrate comprising a bonding surface bonding to the lens surface of the lens substrate, and the spacer substrate comprising a plurality of through holes respectively exposing the lenses; and
   an alignment device comprising a dam structure and a post, wherein
   the dam structure comprises a groove and one of the dam structures and the post is disposed on the lens surface of the lens substrate, the other is disposed on the bonding surface of the spacer substrate and the post is disposed in the groove of the dam structure.

8. The module as claimed in claim 7, wherein the dam structure comprises two arms clipping the post.

9. The module as claimed in claim 8, wherein the arms are flexible.

10. The module as claimed in claim 7, further comprising two flexible arms extending from the dam structure, wherein the flexible arms and the dam structure surrounds the post.

11. The module as claimed in claim 7, wherein the dam structure or the post disposed on the lens surface of the lens substrate is of the same material with the lenses.

12. The module as claimed in claim 7, wherein
   the lenses are disposed in a plurality of units arranged in a first matrix
   the lens substrate comprises an edge region around the first matrix;
   the through holes of the spacer substrate are arranged in a second matrix corresponding to the lenses; and
   the spacer substrate comprises a periphery region around the through holes.

13. The module as claimed in claim 12, wherein one of the dam structures and the post is protruding from the edge region of the lens substrate, and the other is protruding from the periphery region of the spacer substrate.

14. The module as claimed in claim 12, wherein one of the dam structures and the post is protruding from at least one of the units of the lens substrate beyond the corresponding lens therein, and the other is protruding from the spacers of the spacer substrate.

15. The module as claimed in claim 12, wherein the post is protruding from at least one of the units of the lens substrate beyond the corresponding lens therein, and the spacer substrate between the through holes act as the dam structure.

16. A semiconductor device, comprising:
   a semiconductor wafer comprising a plurality chips on an active surface thereof;
   a lens substrate comprising a bonding surface bonding to the active surface of the semiconductor wafer, and the lens substrate comprising a plurality of lenses respectively over the chips; and
   an alignment device comprising a dam structure and a post, wherein the dam structure comprises a groove and one of the dam structures and the post is disposed on the active surface of the semiconductor substrate, the other is disposed on the bonding surface of the lens substrate, and the post is disposed in the groove of the dam structure.

17. The device as claimed in claim 16, wherein the dam structure comprises two arms clipping the post.

18. The device as claimed in claim 17, wherein the arms are flexible.

19. The device as claimed in claim 16, further comprising two flexible arms extending from the dam structure, wherein the flexible arms and the dam structure surrounds the post.

20. The device as claimed in claim 16, wherein the dam structure or the post disposed on the bonding surface of the lens substrate is of the same material with the lenses.

21. The device as claimed in claim 16, wherein
   the chips are arranged in a first matrix;
   the semiconductor wafer comprises a periphery region around the chips;
   the lenses are disposed in a plurality of units arranged in a second matrix; and
   the lens substrate comprises an edge region around the second matrix.

22. The device as claimed in claim 21, wherein one of the dam structures and the post is protruding from the periphery region of the semiconductor wafer, and the other is protruding from the edge region of the lens substrate.

23. The device as claimed in claim 21, wherein one of the dam structures and the post is protruding from at least one of the units of the lens substrate beyond the corresponding lens therein, and the other is protruding from at least one of the chips corresponding to the at least one of the units.

* * * * *